(12) United States Patent
Zhang et al.

(10) Patent No.: US 12,218,684 B2
(45) Date of Patent: Feb. 4, 2025

(54) LAYERED SEMI PARALLEL LDPC DECODER SYSTEM HAVING SINGLE PERMUTATION NETWORK

(71) Applicant: CHONGQING UNIVERSITY OF POSTS AND TELECOMMUNICATIONS, Chongqing (CN)

(72) Inventors: Hongsheng Zhang, Chongqing (CN); Taiyun Ding, Chongqing (CN); Ting Liu, Chongqing (CN); Hong Yang, Chongqing (CN); Yi Huang, Chongqing (CN); Weizhong Chen, Chongqing (CN); Qi Wang, Chongqing (CN); Xi Wang, Chongqing (CN)

(73) Assignee: Chongqing University Of Posts And Telecommunications, Chongqing (CN)

( * ) Notice: Subject to any disclaimer, the term of this patent is extended or adjusted under 35 U.S.C. 154(b) by 0 days.

(21) Appl. No.: 17/792,601

(22) PCT Filed: Nov. 15, 2021

(86) PCT No.: PCT/CN2021/130546
§ 371 (c)(1),
(2) Date: Jul. 13, 2022

(87) PCT Pub. No.: WO2022/116799
PCT Pub. Date: Jun. 9, 2022

(65) Prior Publication Data
US 2023/0037965 A1    Feb. 9, 2023

(30) Foreign Application Priority Data
Dec. 3, 2020  (CN) .......................... 202011411615.5

(51) Int. Cl.
H03M 13/11    (2006.01)

(52) U.S. Cl.
CPC .... H03M 13/1137 (2013.01); H03M 13/1111 (2013.01); H03M 13/1134 (2013.01); H03M 13/1177 (2013.01)

(58) Field of Classification Search
CPC .......... H03M 13/1134; H03M 13/1111; H03M 13/1177; H03M 13/1137; H03M 13/114; H03M 13/116; H03M 13/11; Y02D 30/70
See application file for complete search history.

(56) References Cited

U.S. PATENT DOCUMENTS

| | | | | |
|---|---|---|---|---|
| 8,140,932 B2 * | 3/2012 | Blankenship | ..... | H03M 13/2739 714/755 |
| 8,713,399 B1 * | 4/2014 | Tsatsaragkos | ..... | H03M 13/1111 714/752 |

(Continued)

OTHER PUBLICATIONS

X. Peng, Z. Chen, X. Zhao, F. Maehara and S. Goto, "High parallel variation Banyan network based permutation network for reconfigurable LDPC decoder," ASAP 2010—21st IEEE International Conference on Application-specific Systems, Architectures and Processors, Rennes, France, 2010, pp. 233-238.*

(Continued)

*Primary Examiner* — Steve N Nguyen
(74) *Attorney, Agent, or Firm* — Michael D. Eisenberg

(57) ABSTRACT

The present invention relates to a layered semi-parallel LDPC decoder system having a single permutation network, and belongs to the field of decoder hardware design. The system comprises a layered decoding architecture of the single permutation network, a layered semi-parallel decoding architecture of the single permutation network, a pipeline design for layered semi-parallel decoding and a hardware framework of a layered semi-parallel LDPC decoder. The present invention removes a permutation network module between a check node and a variable node by modifying the cyclic shift value of each information block transferred (Continued)

from the variable node to the check node, i.e., the cyclic shift operation of the decoder can be completed through the single permutation network so as to reduce hardware resources of the decoder. A semi-parallel decoding structure is adopted, and meanwhile, a pipeline is added between half layers. Compared with a decoder with a layered full-parallel structure, a decoder with a semi-parallel structure has the degree of parallelism of a variable node equal to only half of the code length but can achieve ¾ of the throughput as well as reduce hardware resources by half.

3 Claims, 4 Drawing Sheets

(56) References Cited

U.S. PATENT DOCUMENTS

| | | | | |
|---|---|---|---|---|
| 9,748,973 | B2* | 8/2017 | Zhang | H03M 13/114 |
| 2005/0204253 | A1* | 9/2005 | Sukhobok | H03M 13/118 |
| | | | | 714/752 |
| 2006/0020870 | A1* | 1/2006 | Hocevar | H03M 13/1177 |
| | | | | 714/752 |
| 2007/0089019 | A1* | 4/2007 | Tang | H03M 13/1102 |
| | | | | 714/752 |
| 2009/0031094 | A1* | 1/2009 | Chavet | H03M 13/2775 |
| | | | | 711/E12.001 |
| 2009/0063931 | A1* | 3/2009 | Rovini | H03M 13/1137 |
| | | | | 714/801 |
| 2009/0113256 | A1* | 4/2009 | Radosavljevic | H03M 13/1185 |
| | | | | 714/699 |
| 2014/0129895 | A1* | 5/2014 | Petrov | H03M 13/255 |
| | | | | 714/752 |
| 2016/0013810 | A1* | 1/2016 | Gross | H03M 13/09 |
| | | | | 714/776 |

OTHER PUBLICATIONS

Zhang, Zhengya. "Design of LDPC Decoders for Improved Low Error Rate Performance". Electrical Engineering and Computer Sciences University of California at Berkeley, Jul. 10, 2009.*

* cited by examiner

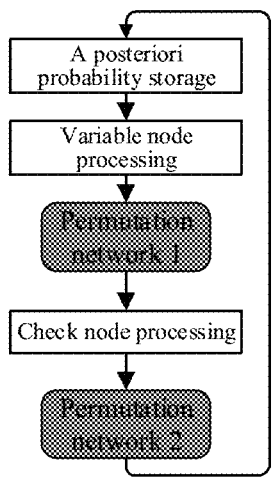
Fig. 1
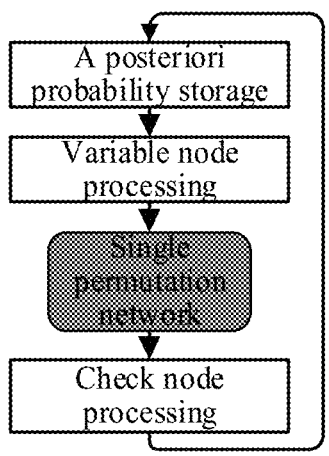
Fig. 2
$$H_b = \begin{bmatrix} 5 & 12 & 0 & \ldots \\ 12 & 11 & 24 & \ldots \\ 17 & 20 & 38 & \ldots \end{bmatrix} \Rightarrow H_{offset} = \begin{bmatrix} 5 & 12 & 0 & \ldots \\ 7 & 41 & 24 & \ldots \\ 5 & 9 & 14 & \ldots \end{bmatrix}$$
(a)            (b)
Fig. 3

LAYERED SEMI PARALLEL LDPC DECODER SYSTEM HAVING SINGLE PERMUTATION NETWORK

FIELD OF INVENTION

The present invention belongs to the field of decoder hardware design, and relates to a layered semi-parallel LDPC decoder system having a single permutation network.

BACKGROUND ART OF THE INVENTION

One of the most obvious features of wireless communication is channels which are shared by all transmitters, but the shared channels will bring very serious interference. Therefore, one of core issues that designers think about is how to transmit information as reliably as possible in wireless channels to reduce errors in information transmission and not to reduce the whole information transmission efficiency of a transmit-receive system so as to take into account the reliability and effectiveness of the whole system. Error correcting codes add some extra bits to an information source to be transmitted at a transmitting end and then extend information carried on the bits of the information source to the extra bits, and finally, errors in received data are decoded and corrected at a receiving end, which enhances the ability of data of resisting various interference during transmission and improves the reliability of the system.

The low density parity check code (LDPC) code is one of error correcting codes and a grouping error correcting code of a sparse parity check matrix, and has the following major advantages: the LDPC code is an error correcting code with performance close to the Shannon limit, a parallel processing mode can be introduced, decoding is relatively simple, and hardware design is not difficult because of easy description. In 1997, D. MacKay re-studied the LDPC code from the perspective of the modern coding theory, and such excellent coding theory began to be revived. Nowadays, with the enhancement of the computer technology and the development of the relevant theories, the LDPC code attracted people again and became one of mainstream error correcting schemes. The LDPC code, especially that with relatively long code length, has been incorporated by communication standard organizations into various communication standards such as IEEE802.11, CCSDS and DVB-S2 issued thereby due to the excellent decoding and error correcting abilities. In the 3G and 4G eras, the Turbo code is always identified as a channel code, while in the 5G era, the LDPC is used as a channel code of a 5G Enhance Mobile Broadband (eMBB) scenario.

With the continuous progress of the modern communication technology, communication systems gradually develop towards higher throughput, larger capacity and higher reliability, and accordingly, channel error correcting codes are widely used. Meanwhile, the LDPC code has inherent decoding parallelism because of the structure of the check matrix, which can meet the requirements of high speed and high throughput. Therefore, the LDPC code shows excellent performance and application prospect in aspects of extending the service range of a new generation of wireless communication systems and increasing the throughput of video broadcast systems.

In order to meet the increasing demand of people for communication, various communication standards propose increasing requirements for throughput in data transmission, i.e., the requirements of high speed and high throughput are proposed in data transmission. In order to meet the requirement of various communication technology standards for high throughput in data transmission, a high-throughput LDPC decoder is needed. The traditional high-throughput decoders usually adopt the full-parallel method to realize decoding, the updating of all check nodes and variable nodes in a full-parallel decoding structure is performed simultaneously in the same clock cycle, the decoding rate is high, and the throughput rate is high, which come at the expense of decoding complexity, and the decoding complexity increases exponentially with the increase of code length. Moreover, the full-parallel decoding method consumes a large amount of hardware resources, and the power consumption of a circuit is also high. In addition, the circuit of a full-parallel structure also has the problems of line block and long interconnection, which leads to poor time sequence of the decoder and reduces the maximum clock frequency of the circuit.

DISCLOSURE OF THE INVENTION

In view of this, the purpose of the present invention is to provide a layered semi-parallel LDPC decoder system having a single permutation network.

To achieve the above purpose, the present invention provides the following technical solution:

A layered semi-parallel LDPC decoder system having a single permutation network, which adopts the minimum-sum decoding algorithm and comprises a layered decoding architecture of the single permutation network, a layered semi-parallel decoding architecture of the single permutation network, a pipeline design for layered semi-parallel decoding and a hardware framework of a layered semi-parallel LDPC decoder.

Optionally, the layered decoding architecture of the single permutation network is used to complete the cyclic shift operation in layered decoding, and comprises an APP RAM (a posteriori probability random access memory) module, a variable node processing module, a permutation network module and a check node processing module, wherein the single permutation network module can complete two cyclic shift operations in layered decoding by modifying a cyclic shift value in a check matrix;

One end of the APP RAM module is connected with the variable node processing module, and the other end is connected with the check node processing module;

One end of the variable node processing module is connected with the APP RAM module, and the other end is connected with the single permutation network module;

One end of the single permutation network module is connected with the variable node processing module, and the other end is connected with the check node processing module;

One end of the check node processing module is connected with the single permutation network module, and the other end is connected with the APP RAM module;

The cyclic shift value of the single permutation network module is equal to the difference between cyclic shift values of two continuous layers in a base check matrix $H_b$. The cyclic shift value $Shift(m,n)$ is represented by formula 1, wherein $\lambda_n(k)$ represents the $k^{th}$ line of index of non-zero elements in the $n^{th}$ column in the base matrix $H_b$.

$$\text{Shift }(m, n) = \begin{cases} P(m, n) \text{ when } m = \lambda_n(0) \& (iter = 0); \\ \mod (P(m, n) - P(\lambda_n(k-1), n), 42) \\ \text{ when } m = \lambda_n(k) \& (iter = 0); \\ \mod (P(m, n) - P(\lambda_n(d_v - 1), n), 42) \\ \text{ when } m = \lambda_n(0) \& (iter > 0); \end{cases} \quad (1)$$

Optionally, the layered semi-parallel decoding architecture of the single permutation network comprises APP RAM units, variable-node function units VFUs, check-node function units CFUs and permutation network PN units;

One end of the APP RAM unit is in signal connection with the variable-node function unit VFU, and the other end is connected with the permutation network PN unit;

One end of the variable-node function unit VFU is connected with the APP RAM unit, and the other end is connected with the permutation network PN unit;

One end of the permutation network PN unit is in signal connection with the variable-node function unit VFU, and the other end is connected with the check-node function unit CFU;

One end of the check-node function unit CFU is connected with the permutation network PN unit, and the other end is connected with the APP RAM unit;

The layered semi-parallel decoding architecture instantiates i APP RAM units, i variable-node function units VFUs, i permutation network modules and z check-node function units CFUs; wherein $$i = \frac{N/z}{2},$$

N is the information code length of an LDPC code, and z is an expansion factor;

The updating of the check-node function unit CFU is divided into two stages:

In the first stage, the first half of APPs (a posteriori probability) are transferred to each check-node function unit CFU through a permutation network, and first i inputs are used to calculate a minimum value, a second minimum value and symbolic information, respectively called $m_{1\_}p_1$, $m_{2\_}p_1$ and $sg\_p_1$, as shown in formula 2, wherein sign( ) represents symbolic integration of i APPs $\vec{q}_{mk}$, $\min_1( )$ represents a minimum value in i APPs $\vec{q}_{mk}$, and $\min_2( )$ represents a second minimum value in i APPs $\vec{q}_{mk}$;

$$sg\_p_1 = \text{sign}(\vec{q}_{mk}); k \in [1, i]$$

$$m_{1\_}p_1 = \min_1(\vec{q}_{mk});$$

$$m_{2\_}p_1 = \min_2(\vec{q}_{mk}); \quad (2)$$

in the second stage, the second half of the APPs are transferred to each check-node function unit CFU through the permutation network, the check-node function unit CFU uses the APPs of last i inputs to calculate a minimum value, a second minimum value and symbolic information, respectively called $m_{1\_}p_2$, $m_{2\_}p_2$ and sg_p2, and the final check node updating can be realized only by combining results of the previous stage and the current stage in the second stage, as shown in formula 3;

$$sg\_final = \text{sign}(sg\_p_1, sg\_p_2);$$

$$m_1\_final = \min_1(m_{1\_}p_1, m_{1\_}p_2);$$

$$m_2\_final = \min_2(m_{1\_}p_1, m_{1\_}p_2, m_{2\_}p_1, m_{2\_}p_2); \quad (3)$$

wherein sg_final, $m_1$_final and $m_2$_final are respectively the final symbolic information, the final minimum value and the final second minimum value of the APPs;

The updating of the variable node is divided into two stages, APPs in first i LLR blocks are updated in the first stage, and APPs in last i LLR blocks are updated in the second stage;

Optionally, the pipeline design for layered semi-parallel decoding adopts a semi-parallel decoding structure, and one layer in the decoding time sequence of the pipeline design comprises a first half layer and a second half layer, and each layer comprises states of State_1, State_2, State_3 and State_4;

The first half layer comprises a VC stage, an RP stage ad a CT stage; and the second half layer comprises a VC stage, an RP stage, a CF stage and a CF2 stage;

Wherein the state of State_1 corresponds to the VC stage and the CF2 stage, the state of State_2 corresponds to the RP stage and the VC stage, the state of State_3 corresponds to the CT stage and the RP stage, and the state of State_4 corresponds to the CF stage;

During each sub-iteration, two stages of updating of the check node are performed in CT and CF, and two stages of updating of the variable node are performed in CF and CF2.

Optionally, the hardware framework of a layered semi-parallel LDPC decoder comprises a top control module, an MUX2_1 module, a permutation network module, an APP RAM (a posteriori probability random access memory) module, a MUX3_1 module, a check-node function unit CFU module and a sequence output module;

The top control module controls the time sequence of other modules through state transfer of control signals;

The mux2_1 module is a one-from-two module, which is used to select LLR information first input for decoding and APPs updated by the check node and connected with the APP RAM module;

The mux3_1 module is a one-from-three module, which is used to select LLR information first input for decoding, APPs updated by the check node and all-zero information in case that a check matrix is negative, one end of the mux3_1 module is in signal connection with the APP RAM module, and the other end is in signal connection with the permutation network module;

The permutation network module is used for cyclic shift operation of parallel data, one end of the permutation network module is in signal connection with the mux2_1 module, and the other end is in signal connection with the APP RAM module;

The APP RAM module stores the first half of APPs and the second half of APPs, and is respectively connected with the permutation network module, the mux3_1 module and the sequence output module;

The check-node function unit CFU module is used to calculate a minimum value and a second minimum value in inputs to update external information and APPs;

The sequence output module is used for decoding decision outputs. When decoding reaches the maximum number of times or satisfies a parity check matrix, the decoder stops decoding, and the highest bit of the APPs is taken as the output of a hard decision result.

The present invention has the following beneficial effects: the permutation network module between the check node and the variable node is removed by modifying the cyclic shift value of each information block transferred from the variable node to the check node, i.e., the cyclic shift operation of the decoder can be completed through the single permutation network so as to reduce hardware resources of the decoder; the degree of parallelism of the variable node of the decoder with a semi-parallel structure is equal to only half of the code length, and a pipeline is added between half layers, which can achieve nearly ¾ of the throughput of a layered full-parallel LDPC decoder and reduce hardware resources by half.

Other advantages, objectives and features of the present invention will be illustrated in the following description to some extent, and will be apparent to those skilled in the art based on the following investigation and research to some extent, or can be taught from the practice of the present invention. The objectives and other advantages of the present invention can be realized and obtained through the following description.

DESCRIPTION OF THE DRAWINGS

To enable the purpose, the technical solution and the advantages of the present invention to be more clear, the present invention will be preferably described in detail below in combination with the drawings, wherein:

FIG. 1 is a diagram of a traditional layered decoding architecture;

FIG. 2 is a diagram of a layered decoding architecture of a single permutation network;

FIG. 3 shows a base check matrix and a modified check matrix;

DETAILED DESCRIPTION OF THE INVENTION

Figure 4:
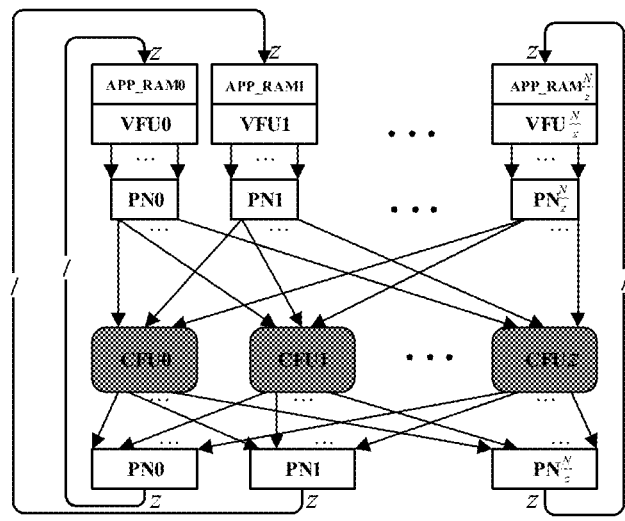
FIG. 4 is a diagram of a layered full-parallel decoding architecture.

Embodiments of the present invention are described below through specific embodiments. Those skilled in the art can understand other advantages and effects of the present invention easily through the disclosure of the description. The present invention can also be implemented or applied through additional different specific embodiments. All details in the description can be modified or changed based on different perspectives and applications without departing from the spirit of the present invention. It should be noted that the figures provided in the following embodiments only exemplarily explain the basic conception of the present invention, and if there is no conflict, the following embodiments and the features in the embodiments can be mutually combined.

Wherein the drawings are only used for exemplary description, are only schematic diagrams rather than physical diagrams, and shall not be understood as a limitation to the present invention. In order to better illustrate the embodiments of the present invention, some components in the drawings may be omitted, scaled up or scaled down, and do not reflect actual product sizes. It should be understandable for those skilled in the art that some well-known structures and description thereof in the drawings may be omitted.

Same or similar reference numerals in the drawings of the embodiments of the present invention refer to same or similar components. It should be understood in the description of the present invention that terms such as "upper", "lower", "left", "right", "front" and "back" indicate direction or position relationships shown based on the drawings, and are only intended to facilitate the description of the present invention and the simplification of the description rather than to indicate or imply that the indicated device or element must have a specific direction or constructed and operated in a specific direction, and therefore, the terms describing position relationships in the drawings are only used for exemplary description and shall not be understood as a limitation to the present invention; for those ordinary skilled in the art, the meanings of the above terms may be understood according to specific conditions.

With reference to FIG. 1-FIG. 9, a layered semi-parallel LDPC decoder system having a single permutation network is shown.

1. Layered Decoding Architecture of Single Permutation Network

A traditional layered decoder uses a permutation network for cyclic shift operation before and after check node processing, as shown in FIG. 1. During the iteration process of decoding of each layer, APPs (a posteriori probability) are cyclically shifted through the permutation network first before check node processing, then the APPs updated by the check node are cyclically shifted by the permutation network in a reverse order, and the purpose of two cyclic shift operations is to enable the check node to read and store the APPs in an appropriate order.

Layered decoding is to transfer the iteration information of a layer to a next layer after the layer is updated. According to the characteristics of the LDPC check matrix, the design proposes to complete two cyclic shift operations in traditional layered decoding only through a single permutation network, as shown in FIG. 2.

FIG. 3($a$) shows a part of an LDPC base check matrix. When a first layer is updated, each APP block is cyclically shifted with values in the first line of the base check matrix. For a traditional layered decoder, each updated APP block is also cyclically shifted with values in the first line of the base check matrix in a reverse order. In the design, the difference between cyclic shift values of the first and second lines is used to replace values in the second line of the original base check matrix so as to remove second cyclic shift operation during updating of the first layer. As shown in FIG. 3($b$), the cyclic shift value of a first APP block is 5 during updating of the first layer, the original cyclic shift value is 12 during updating of a second layer, the reverse cyclic shift operation during updating of the first layer can be removed by replacing the cyclic shift value during updating of the second layer by the difference of 7 between the first and second lines, and cyclic shift values during updating of other layers are the same.

Under the condition of only using the single permutation network, the stored APPs do not need to be arranged in an initial order. Before check node processing, the cyclic shift value of the permutation network is equal to the difference of cyclic shift values of two continuous layers in a base check matrix $H_b$, and the cyclic shift value Shift(m,n) is represented by formula 1, wherein $\lambda_n(k)$ represents the $k^{th}$ line of index of non-zero elements in the $n^{th}$ column in the base matrix $H_b$.

$$\text{Shift } (m, n) = \begin{cases} P(m, n) \text{ when } m = \lambda_n(0) \& (iter = 0); \\ \mod (P(m, n) - P(\lambda_n(k-1), n), 42) \\ \quad \text{ when } m = \lambda_n(k) \& (iter = 0); \\ \mod (P(m, n) - P(\lambda_n(d_v - 1), n), 42) \\ \quad \text{ when } m = \lambda_n(0) \& (iter > 0); \end{cases} \quad (1)$$

2. Layered Semi-Parallel Decoding Architecture of Single Permutation Network

A traditional layered full-parallel LDPC decoder architecture is shown in FIG. 4. Main modules comprise variable-node function units (VFUs), APP RAMs (a posteriori probability random access memory), check-node function units (CFUs) and permutation networks (PNs). N pieces of LLR information input at one time are first grouped and sorted by the variable-node function unit, the N pieces of LLR information are divided into N/z groups in total, and each group contains z pieces of information. The z pieces of information of each group are cyclically shifted through a permutation network first, and then transmitted into different check-node function units. z check-node function units work in parallel, and each check-node function unit has N/z inputs and N/z outputs; the check-node function unit calculates a minimum value and a second minimum value in valid inputs to update external information and N/z APPs (a posteriori probability); and each of the N/z outputs of the z check-node function units forms a group of APP vectors. Then, the z updated APPs are cyclically shifted through a permutation network in a reverse order, and written back to the APP RAM. Wherein N is the information code length of the LDPC code, and z is an expansion factor.

Figure 5:
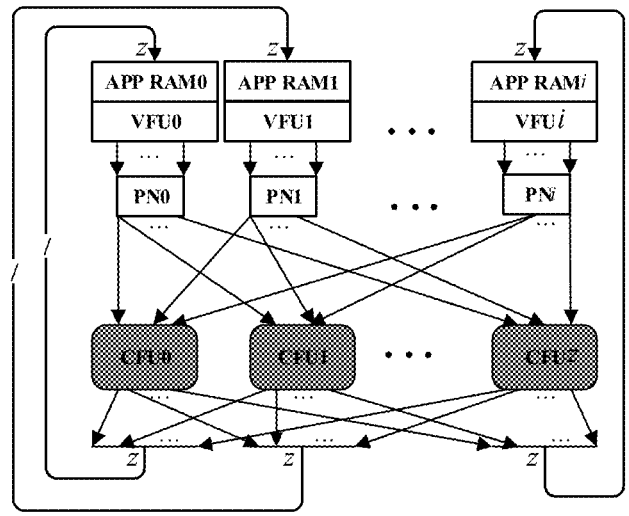
FIG. 5 is a decoding time sequence diagram of a half layer pipeline structure.

In order to achieve balance between hardware resources and throughput of the LDPC decoder, a layered semi-parallel architecture of a single permutation network is proposed, as shown in FIG. 5. Compared with a full-parallel architecture, a semi-parallel architecture only instantiates i APP RAM modules and i variable-node function units, so the number of permutation network modules is also reduced to i. The degree of parallelism of a variable node processor is reduced from N to N/2, and the degree of parallelism of a check node processor is maintained to z. Wherein $$i = \frac{N/z}{2}.$$

The updating of the check node of each layer of decoding is divided into two stages in layered decoding. In the first stage of updating of the check node, the first half of APPs are transmitted into each CFU through a permutation network, and meanwhile, an empty submatrix in a parity check matrix is set to a positive large number to prevent wrong information from being brought to the check node processor. One CFU has i APP inputs, and the CFU uses first i inputs to calculate a minimum value, a second minimum value and symbolic information, respectively called $m_1\_p_1$, $m_2\_p_1$ and $sg\_p_1$, as shown in formula 2, wherein sign( ) represents symbolic integration of i APPs $\vec{q}_{mk}$, $\min_1(\ )$ represents a minimum value in i APPs $\vec{q}_{mk}$, and $\min_2(\ )$ represents a second minimum value in i APPs $\vec{q}_{mk}$.

$$sg\_p_1 = \text{sign}(\vec{q}_{mk}); k \in [1, i]$$

$$m_1\_p_1 = \min_1(\vec{q}_{mk});$$

$$m_2\_p_1 = \min_2(\vec{q}_{mk}); \quad (2)$$

In the second stage of updating of the check node, the second half of APPs are transmitted into each CFU through a permutation network. The CFU uses last i input APPs to calculate a minimum value, a second minimum value and symbolic information, respectively called $m_1\_p_2$, $m_2\_p_2$ and $sg\_p_2$. The final check node updating can be realized only by combining results of the previous stage and the current stage in the second stage, as shown in formula 3;

$$sg\_\text{final} = \text{sign}(sg\_p_1, sg\_p_2);$$

$$m_1\_\text{final} = \min_1(m_1\_p_1, m_1\_p_2);$$

$$m_2\_\text{final} = \min_2(m_1\_p_1, m_1\_p_2, m_2\_p_1, m_2\_p_2); \quad (3)$$

The updating of the variable node is divided into two stages. APPs in first i LLR blocks are updated in the first stage, and then, APPs in last i LLR blocks are updated in the second stage.

3. Pipeline Design for Layered Semi-Parallel Decoding

One disadvantage of traditional layered full-parallel decoding is data dependency between layers, i.e., APPs (a posteriori probability) of the current layer must be updated after the corresponding APPs of the previous layer are updated, which prevents a layered full-parallel decoder from establishing a pipeline structure between layers, thus limiting the throughput of the decoder.

Figure 6:
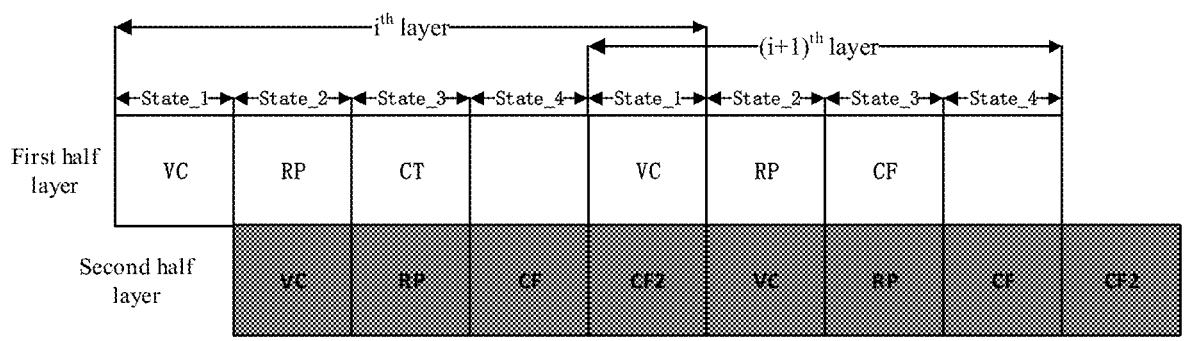
FIG. 6 is a diagram of a layered semi-parallel decoding architecture of a single permutation network.
Figure 7:
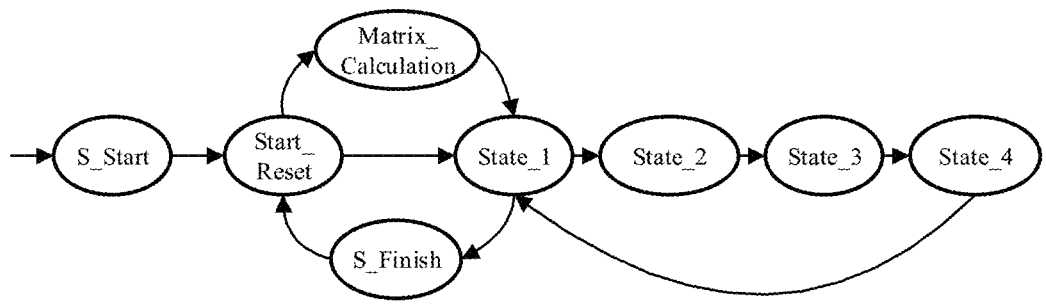
FIG. 7 is a state transfer diagram of a control module.

The design takes into account the balance between hardware resources and throughout and adopts a semi-parallel decoding structure. Due to data dependency of an upper half layer and a lower half layer, a pipeline design can be added between two half layers to achieve higher throughput. The decoding time sequence diagram of a half layer pipeline structure is shown in FIG. 6, the time sequence diagram corresponds to the state transfer diagram of the control module, and the state transfer diagram is shown in FIG. 7, wherein the state of State_1 corresponds to the VC stage and the CF2 stage, the state of State_2 corresponds to the RP stage and the VC stage, the state of State_3 corresponds to the CT stage and the RP stage, and the state of State_4 only corresponds to the CF stage. During each sub-iteration, two stages of updating of the check node are performed in CT and CF, and two stages of updating of the variable node are performed in CF and CF2.

A master control module mainly comprises a finite state machine (FSM) to complete input, output and time sequence control of each submodule, coordinate the iteration of the decoder and ensure smooth iteration, and the state transfer diagram of the state machine of the decoder is shown in FIG. 7.

(1) The state of S_Start is an initialized state, in which the input code rate parameter is configured into each register of the control module and LLR information first iterated and decoded is input into an instruction first_time_on to pull up and skip to a state of Start_Reset; and the state of Start_Reset is a reset state, in which all signals in the control module are reset, and after completion of reset, the LLR information first iterated and decoded is input into the instruction first_time_on to pull down and skip to a state of Matrix_Calculation. The state of Matrix_Calculation is a state of configuring a register by the check matrix, in which parameters of the check matrix are mainly configured into each register of the control module to skip to a state of State_1 after completion of configuration.

(2) The state of State_1 corresponds to the VC and CF2 stages in the time sequence diagram, and only the VC stage is performed when decoding of the first layer is performed in the first iteration. During cyclic VC, first i APPs are read from the APP RAM through the permutation network. Meanwhile, symbols and check node information of external information stored in the line order are read: the minimum value, the second minimum value, and the index and total symbol of the minimum value, and transmitted into the CFU. When the maximum number of iterations is not reached, skip to the state of State_2; and when the maximum number of iterations is reached or the parity check matrix is satisfied, an iteration finish instruction finish_iter is pulled up to skip to the state of S_Finish.

(3) The state of State_2 corresponds to the RP and VC stages in the time sequence diagram, and during cyclic RP, the CFU generates external information and priori information. The symbol and absolute value of the priori information are recorded. Meanwhile, the remaining half of i APPs will also be read from the APP RAM through the permutation network, that is to say a stage of cyclic VC of the remaining half. After completion of operation, skip to the state of State_3.

(4) The state of State_3 corresponds to CT ad RP stages in the time sequence diagram, and during cyclic CT, the CFU calculates a minimum value and a second minimum value in i inputs, corresponding indexes, and the sum of symbols of z pieces of priori information, which is called the current check node information and stored in the RAM. Meanwhile, cyclic RP is also performed on the remaining half. After completion of operation, skip to the state of State_4.

(5) The state of State_4 corresponds to the CF stage in the time sequence diagram, and during cyclic CF, the CFU acquires the current check node information of last i inputs, which belongs to the same layer as the first i inputs. Then, the final check node information is calculated based on the values stored in the cyclic CT stage and the calculated values in the current cycle. The updating process of APPs can be written back to the RAM, and thus is compressed into the cycle. Only the updating and storing processes of APPs are performed in the cyclic CF2 stage. After completion of operation, skip to the state of State_1 for updating of the next layer. After completion of calculation of all layers, skip to the state of State_1 for calculation of next iteration.

(6) The state of S_Finish is a state that all iterations are completed. After completion of all the iterations, the iteration finish instruction finish_iter is pulled up, and then decoding output can be carried out. Skip to the state of Start_Reset for decoding of a next frame of data.

4. Hardware Framework of Layered Semi-Parallel LDPC Decoder

Figure 8:
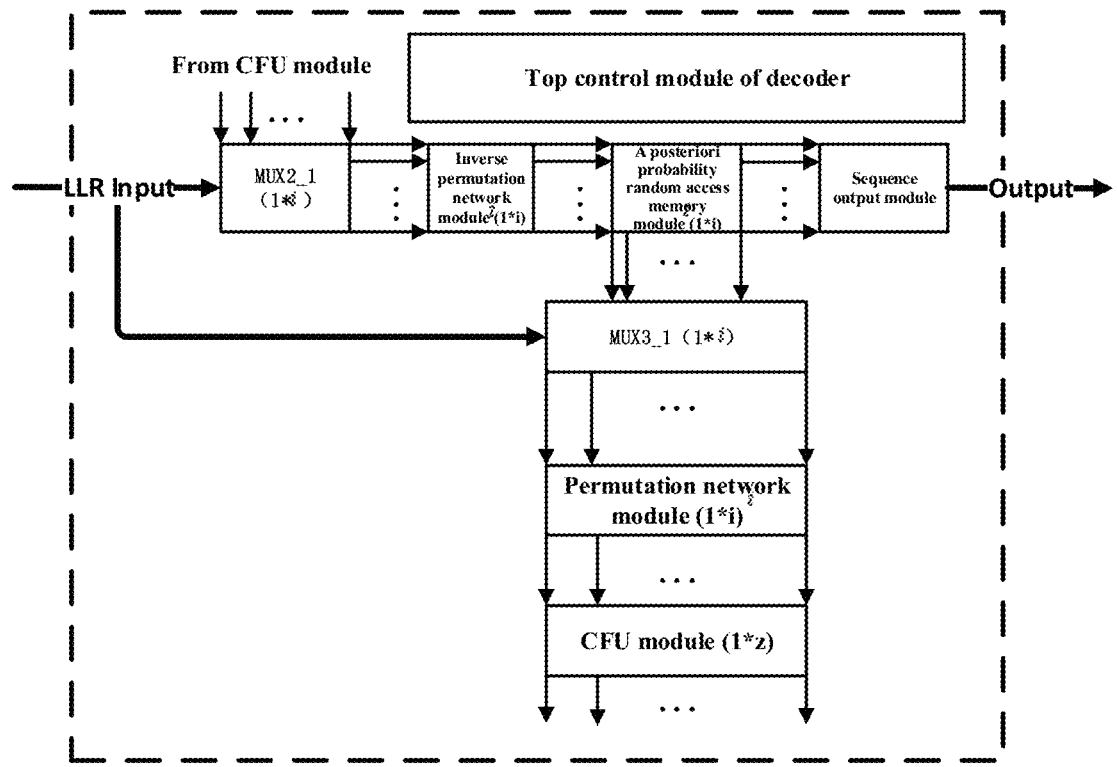
FIG. 8 is a block diagram of an integral structure of a decoder.

The decoder is mainly divided into a top control module, an MUX2_1 module, a permutation network module, an APP RAM (a posteriori probability random access memory) module, an MUX3_1 module, and a check-node function unit (CFU) module. FIG. 8 is the block diagram of the integral structure of the decoder.

Each function module of the decoder is described in detail as follows:

(1) The control module generates control signals to complete time sequence control on each module through state transfer so that the whole decoding process is orderly conducted. The state transfer diagram of the control module is shown in FIG. 7.

(2) The mux2_1 module is a one-from-two module, which is used to select LLR information first input for decoding and APPs (a posteriori probability) updated by the check node; and the mux3_1 module is a one-from-three module, which is used to select LLR information first input for decoding, APPs updated by the check node and all-zero information in case that a check matrix is negative;

(3) The APP RAM module stores the first half of APPs and the second half of APPs. The permutation network module is used for cyclic shift operation of z channels of parallel data, and i permutation network modules are required in total. The sequence output module performs the last link of decoding of one frame of data. When LDPC decoding reaches the maximum number of times or satisfies a parity check matrix, the decoder stops decoding, and the highest bit of the APPs is taken as the output of a hard decision result.

(4) The check-node function unit (CFU) module mainly calculates a minimum value and a second minimum value in valid inputs to update external information and N/z APPs. After the cyclic shift operation of APPs is completed, the updating process of the check node is started. The check-node function unit module can input i APPs in parallel at one time. The minimum value, the second minimum value, the address value of the minimum value and the product of all information symbols of i APPs input first are calculated and stored, and then the same operation is performed on i APPs input later. Finally, the minimum value, the second minimum value, the address value of the minimum value and the product of all information symbols of the two results are calculated again.

Figure 9:
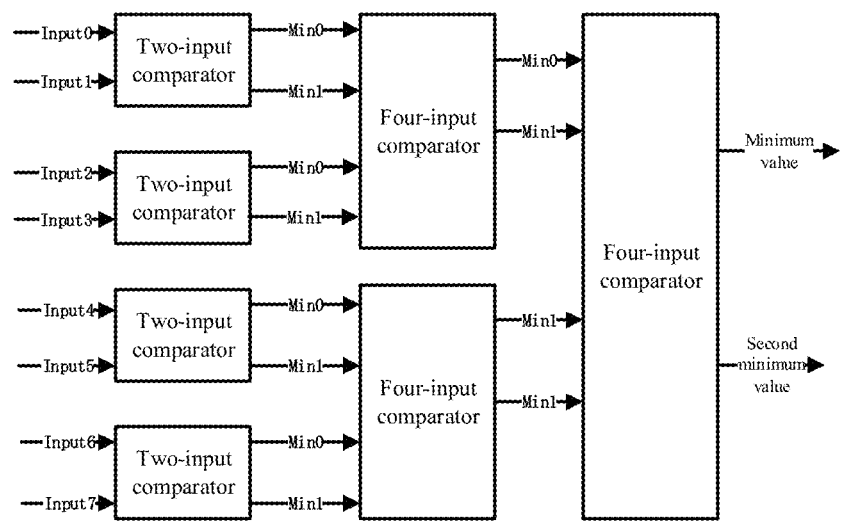
FIG. 9 is a structure diagram of a minimum value and second minimum value operation unit.

The core part of the whole CFU module is to find two minimum values in all input information and determine the response address values of the minimum values. FIG. 9 is the structure diagram of the minimum value and second minimum value operation unit, of which the input is information transferred to check nodes by eight variable nodes, and the information values are all non-negative values after absolute values are taken.

After the minimum value, the second minimum value, the address value of the minimum value and the product of all information symbols of N/z APPs are calculated, additive operation is performed between the APPs and the calculated minimum value, second minimum value and product of all information symbols, thus obtaining APPs updated by the check node.

5. System Test

In this design, an LDPC code with the code length of 672 and the code rate of 1/2 in the IEEE802.11ad standard is taken as an example to design and implement a layered semi-parallel LDPC decoder having a single permutation network. In the IEEE802.11ad standard, N=672, z=42 and $$i = \frac{N/z}{2} = 8.$$

One iteration decoding needs eight layers of updating, and one layer of updating needs eight clock cycles, i.e., corresponding to four transfer states (State_1, State_2, State_3 and State_4) of the state machine, so one iteration decoding needs 32 clock cycles; and the updating of the last iteration decoding is performed in the third clock cycle (State_3) of the next iteration decoding. When the LDPC decoder simulates one frame of data, each change of output_tb data indicates that the decoding data is updated after completion of one iteration decoding. During simulation, the APPs satisfy the parity check matrix after six iteration decodings, valid_output is pulled up after the seventh parity check, indicating that the decoding output is valid, and then decoding output is performed. Since the parity check matrix is satisfied before decoding reaches the maximum number of iterations, the decoding is correct.

Finally, it should be noted that the above embodiments are only used for describing, rather than limiting the technical solution of the present invention. Although the present invention is described in detail with reference to the preferred embodiments, those ordinary skilled in the art shall understand that the technical solution of the present invention can be amended or equivalently replaced without departing from the purpose and the scope of the technical solution. The amendment or equivalent replacement shall be covered within the scope of the claims of the present invention.

The invention claimed is:

1. A layered semi-parallel LDPC decoder system having a single permutation network, characterized by comprising a layered decoding architecture of the single permutation network, a layered semi-parallel decoding architecture of the single permutation network, a pipeline design for layered semi-parallel decoding and a hardware framework of a layered semi-parallel LDPC decoder;
   for the layered decoding architecture of the single permutation network, a permutation network is used for cyclic shift operation for layered decoding before and after check node processing, and the cyclic shift operation of the decoder can be completed only through the single permutation network by modifying the cyclic shift value of each information block transferred from a variable node to a check node;
   compared with a full-parallel architecture, a semi-parallel architecture only instantiates i APP RAM (a posteriori probability random access memory) modules and i VFU (variable-node function units), so the number of permutation network modules is also reduced to i; the degree of parallelism of a variable node processor is reduced from N to N/2, and the degree of parallelism of a check node processor is maintained to z, wherein $$i = \frac{N/z}{2},$$

N is an information code length of an LDPC code, and z is an expansion factor;
   the hardware framework of a layered semi-parallel LDPC decoder comprises a top control module, an MUX2_1 module, a permutation network module, an APP RAM (a posteriori probability random access memory) module, a MUX3_1 module, a check-node function unit CFU module and a sequence output module;
   the top control module controls the time sequence of other modules through state transfer of control signals;
   the MUX2_1 module is a one-from-two module, which is used to select LLR (log-likelihood ratio) information first input for decoding and APPs (a posteriori probability) updated by the check node and connected with the APP RAM module;
   the APP RAM module stores a first half of APPs and a second half of APPs, and is respectively connected with the MUX2_1 module, the MUX3_1 module and the sequence output module;
   the MUX3_1 module is a one-from-three module, which is used to select LLR information first input for decoding, APPs updated by the check node and all-zero information in case that a check matrix is negative, one end of the MUX3_1 module is connected with the APP RAM module, and the other end is connected with the permutation network module;
   the permutation network module is used for cyclic shift operation of parallel data, one end of the permutation network module is in signal connection with the MUX3_1 module, and the other end is in signal connection with the APP RAM module;
   the check-node function unit CFU module is used to calculate a minimum value and a second minimum value in inputs to update external information and APPs, one end of the check-node function unit CFU module is connected with the permutation network module, and the other end is in signal connection with the MUX2_1 module;
   the sequence output module is used for decoding decision outputs, and connected with the APP RAM module.

2. The layered semi-parallel LDPC decoder system having a single permutation network as claimed in claim 1, characterized in that the layered decoding architecture of the single permutation network comprises an APP RAM (a posteriori probability random access memory) module, a variable node processing module, a single permutation network module and a check node processing module, wherein the single permutation network module can complete two cyclic shift operations in layered decoding by modifying a cyclic shift value in a check matrix;
   one end of the APP RAM module is connected with the variable node processing module, and the other end is connected with the check node processing module;
   one end of the variable node processing module is connected with the APP RAM module, and the other end is connected with the single permutation network module;
   one end of the single permutation network module is connected with the variable node processing module, and the other end is connected with the check node processing module;
   one end of the check node processing module is connected with the single permutation network module, and the other end is connected with the APP RAM module;
   the cyclic shift value of the single permutation network module is equal to the difference between cyclic shift values of two continuous layers in a base check matrix $H_b$.

3. The layered semi-parallel LDPC decoder system having a single permutation network as claimed in claim 1, characterized in that the layered semi-parallel decoding architecture of the single permutation network comprises APP RAM (a posteriori probability random access memory) units, variable-node function units VFUs, check-node function units CFUs and permutation network PN units;
   one end of the APP RAM unit is in signal connection with the variable-node function unit VFU, and the other end is connected with the permutation network PN unit;
   one end of the variable-node function unit VFU is connected with the APP RAM unit, and the other end is connected with the permutation network PN unit;
   one end of the permutation network PN unit is connected with the variable-node function unit VFU, and the other end is connected with the check-node function unit CFU;
   one end of the check-node function unit CFU is connected with the permutation network PN unit, and the other end is connected with the APP RAM unit;
   the layered semi-parallel decoding architecture instantiates i APP RAM units, i variable-node function units VFUs, i permutation network PN units and z check-node function units CFUs, wherein $$i = \frac{N/z}{2},\qquad(5)$$

N is the information code length of an LDPC code, and z is the expansion factor;

the updating of the check-node function unit CFU is divided into two stages:

in the first stage, the first half of APPs (a posteriori probability) are transferred to each check-node function unit CFU through a permutation network, and first i inputs are used to calculate a minimum value, a second minimum value and symbolic information, respectively called $m_{1\_}p_1$, $m_{2\_}p_1$ and $sg\_p_1$, as shown in formula 1; wherein sign( ) represents symbolic integration of i APPS $\vec{q}_{mk}$, $\min_1(\ )$ represents a minimum value in i APPS $\vec{q}_{mk}$, and $\min_2(\ )$ represents a second minimum value in i APPS $\vec{q}_{mk}$;

$$sg\_p_1 = \operatorname{sign}(\vec{q}_{mk}); k \in [1,i]$$

$$m_{1\_}p_1 = \min_1(\vec{q}_{mk});$$

$$m_{2\_}p_1 = \min_2(\vec{q}_{mk});\qquad(1)$$

in the second stage, the second half of the APPs are transferred to each check-node function unit CFU through the permutation network, the check-node function unit CFU uses the APPs of last i inputs to calculate a minimum value, a second minimum value and symbolic information, respectively called $m_{1\_}p_2$, $m_{2\_}p_2$ and $sg\_p2$, and the final check node updating can be realized only by combining results of the previous stage and the current stage in the second stage, as shown in formula 2;

$$sg\_\text{final} = \operatorname{sign}(sg\_p_1, sg\_p_2);$$

$$m_{1\_}\text{final} = \min_1(m_{1\_}p_1, m_{1\_}p_2);$$

$$m_{2\_}\text{final} = \min_2(m_{1\_}p_1, m_{1\_}p_2, m_{2\_}p_1, m_{2\_}p_2);\qquad(2)$$

wherein sg_final, $m_{1\_}$final and $m_{2\_}$final are respectively the final symbolic information, the final minimum value and the final second minimum value of the APPs;

the updating of the variable node is divided into two stages, APPs in first i LLR blocks are updated in the first stage, and APPs in last i LLR blocks are updated in the second stage.

\* \* \* \* \*